(12) United States Patent
Yang et al.

(10) Patent No.: US 10,345,388 B2
(45) Date of Patent: Jul. 9, 2019

(54) METHOD FOR SCREENING LITHIUM ION BATTERY

(71) Applicants: Jiangsu Huadong Institute of Li-Ion Battery Co., Ltd., Suzhou, Jiangsu (CN); Tsinghua University, Beijing (CN)

(72) Inventors: Yong Yang, Suzhou (CN); Hong-Sheng Zhang, Suzhou (CN); Xiang-Ming He, Beijing (CN); Jian-Jun Li, Beijing (CN); Li Wang, Beijing (CN); Guo-Hua Li, Suzhou (CN); Tuan-Wei Li, Suzhou (CN); Shu-Hui Wang, Suzhou (CN)

(73) Assignees: JIANGSU HUADONG INSTITUTE OF LI-ION BATTERY CO., LTD, Suzhou (CN); TSINGHUA UNIVERSITY, Beijing (CN)

( * ) Notice: Subject to any disclaimer, the term of this patent is extended or adjusted under 35 U.S.C. 154(b) by 278 days.

(21) Appl. No.: 15/618,078

(22) Filed: Jun. 8, 2017

(65) Prior Publication Data

US 2017/0276732 A1     Sep. 28, 2017

Related U.S. Application Data

(63) Continuation of application No. PCT/CN2015/096240, filed on Dec. 3, 2015.

(30) Foreign Application Priority Data

Dec. 8, 2014   (CN) .......................... 2014 1 0740164

(51) Int. Cl.
    *G01R 31/385*    (2019.01)
    *G01R 31/396*    (2019.01)
    (Continued)

(52) U.S. Cl.
    CPC ....... *G01R 31/385* (2019.01); *G01R 31/3865* (2019.01); *G01R 31/396* (2019.01);
    (Continued)

(58) Field of Classification Search
    CPC .......................... G01R 31/385; G01R 31/396; G01R 31/3865; H01M 10/0525; H01M 10/441; H01M 10/482
    (Continued)

(56) References Cited

U.S. PATENT DOCUMENTS

2004/0207367 A1    10/2004   Taniguchi et al.
2009/0072793 A1    3/2009   Chang et al.

FOREIGN PATENT DOCUMENTS

CN     101431166 A     5/2009
CN     102508165 A     6/2012
    (Continued)

OTHER PUBLICATIONS

International Search Report on corresponding PCT application (PCT/CN2015/096240) from International Searching Authority (CN) dated Mar. 9, 2016.

(Continued)

*Primary Examiner* — Melissa J Koval
*Assistant Examiner* — Rahul Maini

(57) ABSTRACT

A method for screening a lithium ion battery is provided. A number of lithium ion batteries are galvanostatically discharged a to an inflection point voltage at an inflection point of a discharge curve at a first constant current $I_1$. The number of lithium ion batteries are rested for a first rest time $T_1$ to raise an open circuit voltage of the number of lithium ion batteries to $U_1$. $U_1$ is greater than the inflection point voltage. The number of lithium ion batteries are galvanostatically discharged to the inflection point voltage at a second constant current $I_2$, in which $I_2 \ll I_1$. The number of lithium ion (Continued)

batteries are rested for a second rest time $T_2$ and the batteries are screened based on a self-discharge of the number of lithium ion batteries.

11 Claims, 4 Drawing Sheets

(51) Int. Cl.
    *H01M 10/0525*     (2010.01)
    *H01M 10/44*     (2006.01)
    *H01M 10/48*     (2006.01)

(52) U.S. Cl.
    CPC ..... *H01M 10/0525* (2013.01); *H01M 10/441* (2013.01); *H01M 10/482* (2013.01)

(58) Field of Classification Search
    USPC .................. 324/426–450; 320/125, 129, 131
    See application file for complete search history.

(56) References Cited

FOREIGN PATENT DOCUMENTS

| | | |
|---|---|---|
| CN | 102728564 A | 10/2012 |
| CN | 102901931 A | 1/2013 |
| CN | 103018566 A | 4/2013 |
| CN | 103464388 A | 12/2013 |
| CN | 103611692 A | 3/2014 |
| CN | 104084383 A | 10/2014 |
| CN | 104090241 A | 10/2014 |
| CN | 104438138 A | 3/2015 |
| EP | 1469321 A1 | 10/2004 |
| JP | 2002343446 | 11/2002 |
| JP | 2010271286 A | 12/2010 |

OTHER PUBLICATIONS

International Search Report on corresponding PCT application (PCT/CN2015/096273) from International Searching Authority (CN) dated Feb. 17, 2016.

METHOD FOR SCREENING LITHIUM ION BATTERY

CROSS-REFERENCE TO RELATED APPLICATIONS

This application claims all benefits accruing under 35 U.S.C. § 119 from China Patent Application No. 201410740164.8, filed on Dec. 8, 2014 in the State Intellectual Property Office of China, the contents of which are hereby incorporated by reference. This application is a continuation of international patent application PCT/CN2015/096240 filed Dec. 3, 2015, the content of which is hereby incorporated by reference.

FIELD

The present disclosure belongs to the field of lithium ion batteries, and particularly relates to methods for screening lithium ion batteries.

BACKGROUND

Lithium ion batteries as energy-saving products, having a high specific energy, a high cycle performance, and a low memory effect, have been widely used in photovoltaic energy storage, electric vehicles, electric tools, digital products, and other industries. The lithium ion batteries with a pollution-free feature have gradually replaced lead-acid batteries. Although a single lithium ion battery has a generally improved performance, the self-discharging rate of the lithium ion batteries in a module is still uneven. Even the single lithium ion battery can be cycled over 2000-3000 times, and the performance of the lithium ion battery module may be generally decreased by 15% due to the uneven self-discharging.

In assembling of the module, the lithium ion batteries are usually screened based on the capacity difference and the internal resistance difference.

SUMMARY

The present disclosure provides a method for screening a lithium ion battery, the method comprising:

galvanostatic discharging a plurality of lithium ion batteries to an inflection point voltage at an inflection point of a discharge curve at a first constant current $I_1$;

resting the plurality of lithium ion batteries for a first rest time $T_1$ to raise an open circuit voltage of the plurality of lithium ion batteries to $U_1$, and $U_1$ is greater than the inflection point voltage;

galvanostatic discharging the plurality of lithium ion batteries to the inflection point voltage at a second constant current $I_2$, wherein $I_2 \ll I_1$; and resting the plurality of lithium ion batteries for a second rest time $T_2$ and screening the batteries based on a self-discharge of the plurality of lithium ion batteries.

In the method for screening a lithium ion battery, the voltage decay caused by the different self-discharge has been fully considered, and the plurality of lithium ion batteries are at the same "starting" line before enter the second rest time. During the second rest time, the more the voltage decay, the larger the self-discharge performance. Thus the batteries having the large self-discharging performance can be removed.

DETAILED DESCRIPTION

Figure 1:
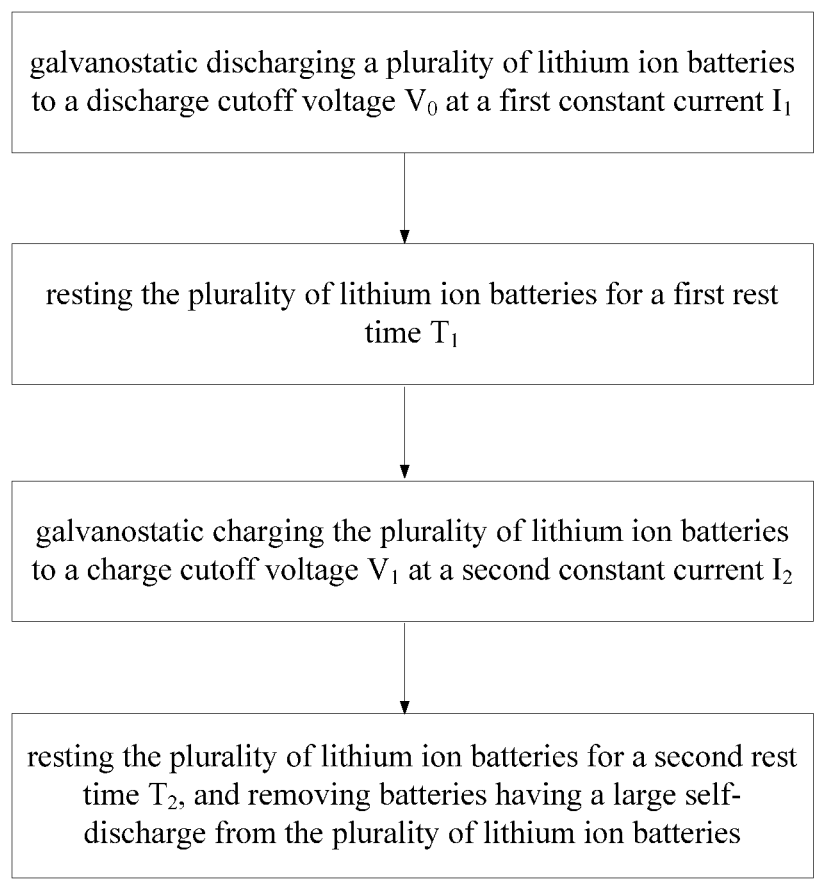
FIG. 1 shows a schematic view of one embodiment of a method for screening a lithium ion battery.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

Referring to FIG. 1, a first embodiment of a method for screening a lithium ion battery comprises:

S10, galvanostatic discharging a plurality of lithium ion batteries to a discharge cutoff voltage $V_0$ at a first constant current $I_1$;

S11, resting the plurality of lithium ion batteries for a first rest time $T_1$;

S12, galvanostatic charging the plurality of lithium ion batteries to a charge cutoff voltage $V_1$ at a second constant current $I_2$; and S13, resting the plurality of lithium ion batteries for a second rest time $T_2$, and removing batteries having a large self-discharge from the plurality of lithium ion batteries.

In step S10, the first constant current $I_1$ can be selected based on the capacity of the lithium ion battery. When the capacity of the lithium ion battery is C (unit: Ah), the first constant current $I_1$ can be in a range from about 0.5 C to about 1 C (unit: A). In one embodiment, the capacity of the lithium ion battery is 20 Ah, and the first constant current $I_1$ is 10 A. The discharge cutoff voltage $V_0$ can be 2.0V to 3.0V, and selected based on materials and discharge curves of the lithium ion battery to have a relatively stable remaining capacity of the lithium ion battery at the cutoff voltage. In one embodiment, the discharge cutoff voltage $V_0$ is 2.5V.

In step S11, the first rest time $T_1$ can be in a range from about 5 minutes to about 10 minutes, and can be selected according to the sensitivity of the apparatus used and the degree of the electrochemical reaction to restore the electrochemical system in the battery to a stable state after the discharging of the lithium ion battery. Furthermore, the discharge current of the lithium ion battery in the stable state can be less than 0.2 mA. In one embodiment, the discharge current is less than 0.1 mA.

In step S12, the second constant current $I_2$ can be the same as or different from the first constant current $I_1$, and in a range from about 0.5 C to about 1 C. The second constant current $I_2$ can be selected according to the capacity of the lithium ion battery, in order to fully charge the lithium ion battery in a short time. In one embodiment, the second constant current $I_2$ is 10 A. The charge cutoff voltage $V_1$ is decided by the material of the lithium ion battery. The charge cutoff voltage $V_1$ can be selected according to the material system and the charge and discharge curves of the lithium ion battery. The charge cutoff voltage $V_1$ can be 3.15 V, 3.10 V, 3.20 V, or 3.7 V. In one embodiment, the charge cutoff voltage $V_1$ is 3.10 V.

Furthermore, in one embodiment, when the lithium ion battery reaches the charge cutoff voltage $V_1$, the lithium ion battery can further be potentiostatically charged to a charge cutoff current $I_0$, which can be as small as possible, and can be in a range from about 0.001 C to about 0.04 C. Furthermore, the charge cutoff current $I_0$ can be in a range from about 0.01 C to about 0.02 C. In one embodiment, the charge cutoff current $I_0$ is 0.2 A. By reducing the charge cutoff current $I_0$, the charge cutoff voltage $V_1$ can be stabilized, and the misjudgment due to the instability of the current in the subsequence can be reduced.

In step S13, the second rest time $T_2$ can be in a range from about 5 days to about 12 days, which depends on the material of the lithium ion battery, in order to exhibit apparent self-discharge phenomenon. The lithium ion batteries are distinguished from each other based on the lithium-based cathode material, such as lithium iron phosphate, lithium nickel cobalt manganese oxide, or lithium manganese oxide. Thus the phenomenon of the self-discharge can be more obvious during the second rest time. During the removing of the lithium ion batteries, the standard of the large self-discharge can be decided according to need. In one embodiment, 0.1 V of the self-discharge voltage decay is taken as a standard, and the self-discharge voltage decay greater than 0.1 V is configured as a large self-discharge.

Referring to Table 1, taking a lithium iron phosphate battery having C=20 Ah for example, then 0.5 C=10 A, 0.1 C=2 A, . . . , 0.3 C=6 A, etc. The plurality of lithium ion batteries can be rest for a predetermined time before discharging the plurality of lithium ion batteries. The voltage of the lithium ion battery before discharging the plurality of lithium ion batteries is 3.4 V, so that the lithium iron phosphate battery is in a 50% state of charge (SOC).

TABLE 1 lithium iron phosphate battery screening process.

| Step | Process | Time (min) | Voltage (V) | Current (A) | Cutoff Current (A) |
|---|---|---|---|---|---|
| 1 | Rest | 5 | | | |
| 2 | Galvanostatic Discharging | 180 | 2.5 | 10 | |
| 3 | Rest | 5 | | | |
| 4 | Galvanostatic Charging | 60 | 3.1 | 10 | 0.2 |

Figure 2:
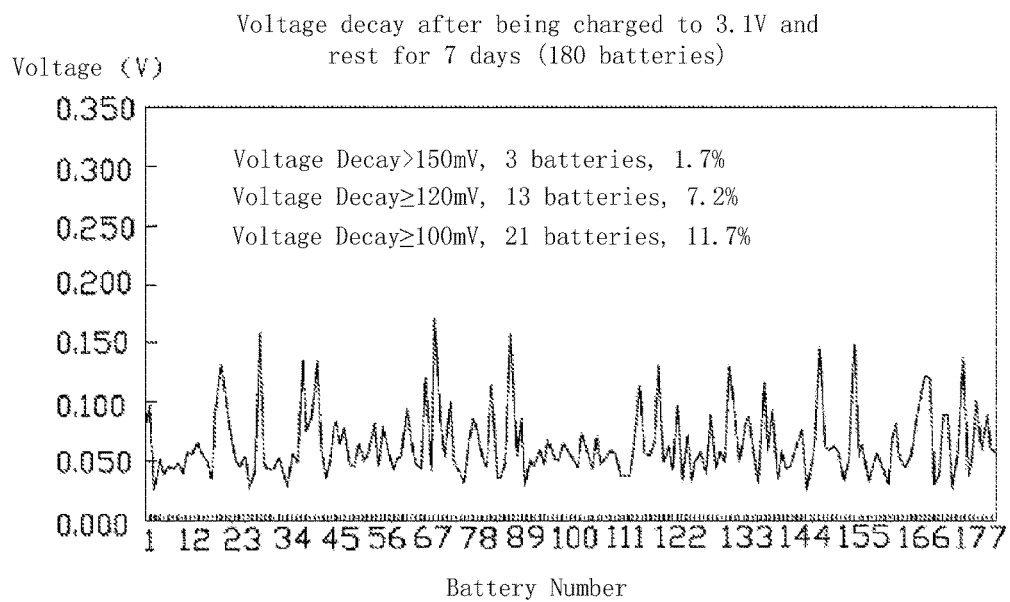
FIG. 2 is a graphic showing voltage attenuations of a plurality of lithium ion batteries resting for 7 days.

In one embodiment, 100 to 200 lithium iron phosphate batteries can be chosen for the data statistics. According to Table 1, after completing the steps 1-4, the batteries are rested for the second rest time $T_2$, such as 7 days. During the second rest time $T_2$, the voltage of the batteries can be tested. At the beginning of the second rest time $T_2$, an initial voltage of the lithium ion battery is 3.1V. In 7 days, the voltage of the lithium ion battery is tested for every predetermined time. Then the battery attenuation can be obtained, and the result is shown in FIG. 2.

During the second rest time $T_2$, the voltage decay is related to the initial voltage and length of the second rest time. The standard of the large self-discharge can be selected according to the actual needs. In one embodiment, while the lithium ion battery is discharged to 2.5 V and then charged to 3.1 V (the charge cutoff current is 0.01 C), it is assumed that after 7 days the voltage decay greater than or equal to 0.1 V is a relatively large self-discharge. The lithium ion batteries with large self-discharge can be clearly selected and removed according to this standard.

Figure 3:
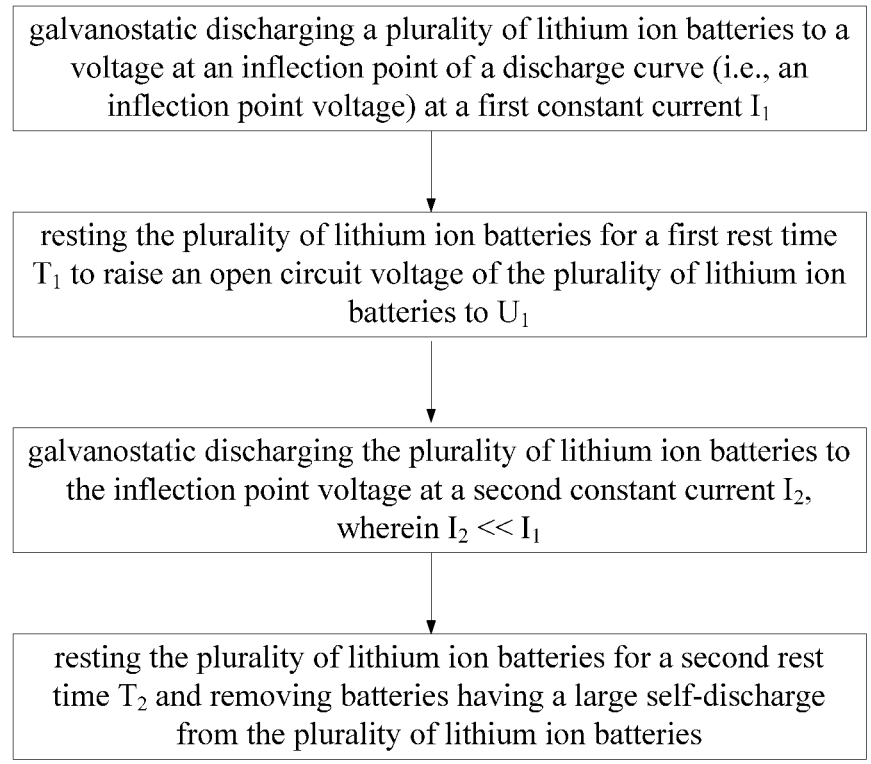
FIG. 3 shows a schematic view of another embodiment of the method for screening a lithium ion battery.

Referring to FIG. 3, a second embodiment of a method for screening a lithium ion batteries comprises the following steps:

S20, galvanostatic discharging a plurality of lithium ion batteries to a voltage at an inflection point of a discharge curve (i.e., an inflection point voltage) at a first constant current $I_1$;

S21, resting the plurality of lithium ion batteries for a first rest time $T_1$ to raise an open circuit voltage of the plurality of lithium ion batteries to $U_1$;

S22, galvanostatic discharging the plurality of lithium ion batteries to the inflection point voltage at a second constant current $I_2$, wherein $I_2 \ll I_1$; and S23, resting the plurality of lithium ion batteries for a second rest time $T_2$ and removing batteries having a large self-discharge from the plurality of lithium ion batteries.

In step S20, the plurality of lithium ion batteries are discharged to the inflection point voltage 3.10 V of the discharge curve.

In step S21, the open circuit voltage can be raised by resting the battery for the first rest time $T_1$, and raised scale of the open circuit voltage is related to the discharge current. Specifically, the open circuit voltage can be raised to greater than the inflection point voltage of the discharge curve. In one embodiment, the open circuit voltage $U_1$ is about 3.15 V. Therefore, it is necessary to discharge again to bring the remaining capacity of the plurality of lithium ion batteries to a relatively stable state.

In step S22, unlike the first embodiment, the second constant current $I_2$ is much smaller than the first constant current $I_1$. In one embodiment, the second constant current $I_2$ is less than or equal to one fifth of the first constant current $I_1$. That is, the second constant current $I_2$ can be in a range from about 0.1 C to about 0.2 C. In one embodiment, the second constant current $I_2$ is 0.1 C, which is one fifth of $I_1$. The second constant current $I_2$ is the smaller the better, such as 0.01 C, 0.05 C, etc., but the discharge time will be increased. Table II is shown below.

TABLE II lithium iron phosphate screening process

| Step. | Process | Time (min) | Voltage (V) | Current (A) | Cutoff Current (A) |
|---|---|---|---|---|---|
| 1 | Rest | 5 | | | |
| 2 | Galvanostatic Discharging | | 3.1 | 10 | |
| 3 | Rest | 5 | | | |
| 4 | Galvanostatic Discharging | 100 | 3.1 | 2 | 0.2 |
| 5 | Rest | 5 | | | |

Referring to Table II, the plurality of lithium ion batteries in the 50% state of charge can be discharged to 3.1 V in the same way as in the first embodiment, and the batteries having relatively large self-discharge are removed. Through analysis experiments and practical applications, it is feasible to determine the self-discharge based on the voltage decay in the rest time of the battery.

Figure 4:
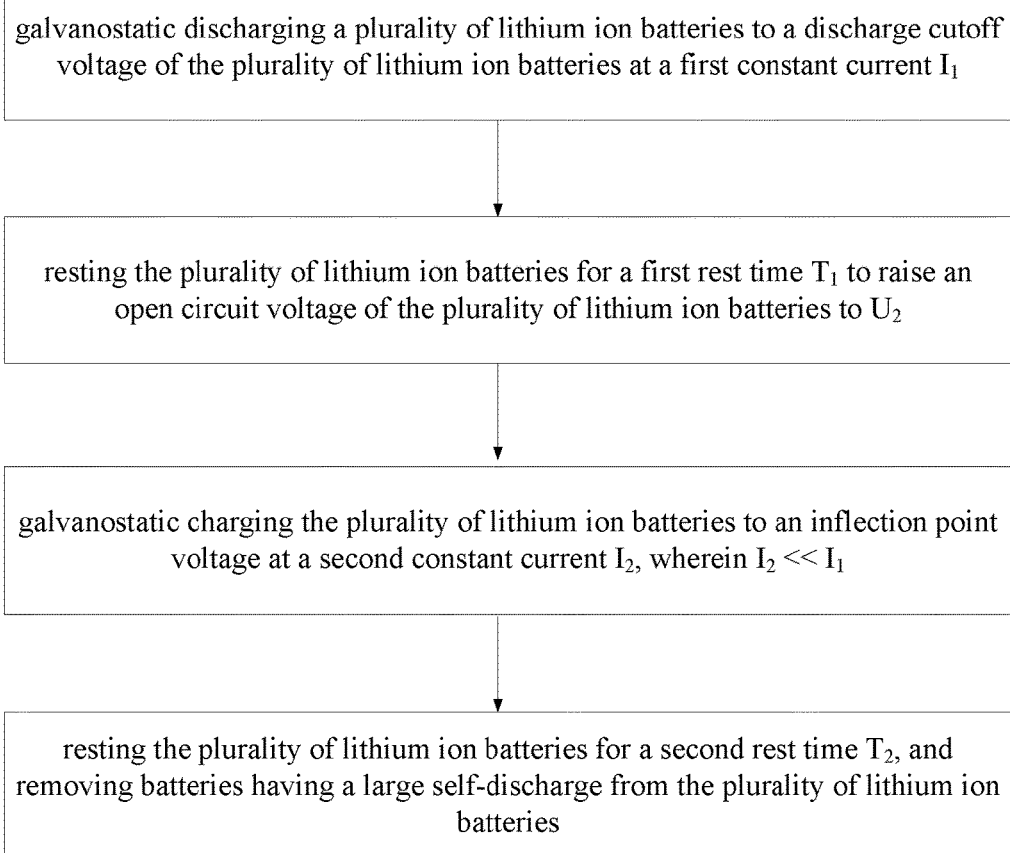
FIG. 4 shows a schematic view of yet another embodiment of the method for screening a lithium ion battery.

Referring to FIG. 4, a third embodiment of a method for screening a lithium ion battery comprises the following steps:

S30, galvanostatic discharging a plurality of lithium ion batteries to a discharge cutoff voltage of the plurality of lithium ion batteries at a first constant current $I_1$;

S31, resting the plurality of lithium ion batteries for a first rest time $T_1$ to raise an open circuit voltage of the plurality of lithium ion batteries to $U_2$;

S32, galvanostatic charging the plurality of lithium ion batteries to an inflection point voltage at a second constant current $I_2$, wherein $I_2 \ll I_1$; and S33, resting the plurality of lithium ion batteries for a second rest time $T_2$, and removing batteries having a large self-discharge from the plurality of lithium ion batteries.

The method for screening a lithium ion battery is similar to the second embodiment, except that the open circuit voltage of the plurality of lithium ion batteries is raised to $U_2$, and $U_2$ is smaller than the inflection point voltage in Step 31. In the present embodiment, the open circuit voltage of the lithium ion battery is raised to 3.05 V after the first rest time $T_1$. Therefore, in the subsequent step S32, the plurality of lithium ion batteries are charged with a small current to the inflection point voltage. Thus the remaining capacity of the lithium ion battery reaches a relatively stable state. The second constant current $I_2$ is less than or equal to ½ of the first constant current $I_1$, such as less than ⅓, less than ⅕, and the like. In the present embodiment, the second constant current $I_2$ is about 2 A. It can be understood that, the second constant current $I_2$ can be less than 1 A, less than 0.5 A, and the like.

TABLE III

Screening process of lithium iron phosphate

| Step. | Process | Time (min) | Voltage (V) | Current (A) | Cutoff Current (A) |
|---|---|---|---|---|---|
| 1 | Rest | 5 | | | |
| 2 | Constant Discharging | 100 | 3.0 | 10 | 0.2 |
| 3 | Rest | 5 | | | |
| 4 | Constant Charging | | 3.0 | 2 | |

Referring to Table III, after the plurality of lithium ion batteries are completely charged at the second constant current, the plurality of lithium ion batteries are rested for the second rest time, and the lithium ion battery with large self-discharge is picked out and removed.

The method for screening a lithium ion battery fully considers the voltage decay caused by the self-discharge. Through charging and discharging the plurality of lithium ion batteries, the plurality of lithium ion batteries are at the same "starting" line before entering the rest period. During the rest period, the more the voltage decay, the larger the self-discharge. Thus the misjudgment can be reduced. By removing the lithium ion batteries having the large self-discharge, the voltage decay of the lithium-ion batteries in the lithium ion battery module is basically the same, thereby the cycle performance of the lithium ion battery module can be dramatically enhanced.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and comprising the full extent established by the broad general meaning of the terms used in the claims. It will therefore be appreciated that the embodiments described above may be modified within the scope of the claims.

What is claimed is:

1. A method for screening a lithium ion battery, the method comprising:
    galvanostatic discharging a plurality of lithium ion batteries to an inflection point voltage at an inflection point of a discharge curve at a first constant current $I_1$;
    resting the plurality of lithium ion batteries for a first rest time $T_1$ to raise an open circuit voltage of the plurality of lithium ion batteries to $U_1$, wherein $U_1$ is greater than the inflection point voltage;
    galvanostatic discharging the plurality of lithium ion batteries to the inflection point voltage at a second constant current $I_2$, wherein $I_2 \ll I_1$; and
    resting the plurality of lithium ion batteries for a second rest time $T_2$ and screening the plurality of lithium ion batteries based on a self-discharge of the plurality of lithium ion batteries.

2. The method of claim 1, wherein the first constant current $I_1$ is in a range from about 0.5 C to about 1 C.

3. The method of claim 1, wherein the second constant current $I_2$ is less than or equal to one fifth of the first constant current $I_1$.

4. The method of claim 1, wherein the second constant current $I_2$ is in a range from about 0.1 C to about 0.2 C.

5. The method of claim 1, wherein the second constant current $I_2$ is in a range from about 0.01 C to about 0.05 C.

6. The method of claim 1, wherein the first rest time $T_1$ is in a range from about 5 minutes to about 10 minutes.

7. The method of claim 1, wherein the second rest time $T_2$ is in a range from about 5 days to about 12 days.

8. The method of claim 1, wherein the screening the plurality of lithium ion batteries comprises removing large self-discharge batteries from the plurality of lithium ion batteries, and wherein the large self-discharge batteries comprise a self-discharge voltage decay greater than 0.1 V.

9. The method of claim 1, wherein the open circuit voltage of the plurality of lithium ion batteries is about 3.15 V.

10. The method of claim 1, further comprising previously resting the plurality of lithium ion batteries for a predetermined time before the galvanostatic discharging the plurality of lithium ion batteries at the first constant current $I_1$ to have the plurality of lithium ion batteries in a 50% state of charge.

11. The method of claim 10, wherein the previously resting the plurality of lithium ion batteries for the predetermined time is at room temperature.

* * * * *